United States Patent
McAravey et al.

(10) Patent No.: US 10,528,654 B2
(45) Date of Patent: Jan. 7, 2020

(54) FACILITATING ANALYSIS OF A ELECTRICAL POWER SYSTEM

(71) Applicant: EasyPower LLC, Tualatin, OR (US)

(72) Inventors: Shaun McAravey, Sherwood, OR (US); Eric Lee Johnson, Beaverton, OR (US); Michael D. Koch, Oregon City, OR (US); Theodore G. Balderree, II, Sherwood, OR (US); Carol Anne Morgan, Oregon City, OR (US); Alan Ricker, Vancouver, WA (US); Kevin Bates, Portland, OR (US)

(73) Assignee: EASYPOWER LLC, Tualatin, OR (US)

( * ) Notice: Subject to any disclaimer, the term of this patent is extended or adjusted under 35 U.S.C. 154(b) by 549 days.

(21) Appl. No.: 14/875,616

(22) Filed: Oct. 5, 2015

(65) Prior Publication Data

US 2017/0097755 A1    Apr. 6, 2017

(51) Int. Cl.
*G06F 3/0484* (2013.01)
*G06F 17/24* (2006.01)
*G06T 11/60* (2006.01)
*G06Q 50/06* (2012.01)
*G06F 17/50* (2006.01)

(52) U.S. Cl.
CPC .......... *G06F 17/241* (2013.01); *G06Q 50/06* (2013.01); *G06T 11/60* (2013.01); *G06F 17/5081* (2013.01); *G06T 2200/24* (2013.01)

(58) Field of Classification Search
CPC ........ G06T 11/60; G06F 17/50; G06F 17/241; G06F 3/048–3/04897; G06Q 50/06
See application file for complete search history.

(56) References Cited

U.S. PATENT DOCUMENTS

| | | | | |
|---|---|---|---|---|
| 6,961,641 | B1 * | 11/2005 | Forth | G06Q 50/06 700/295 |
| 8,095,233 | B1 * | 1/2012 | Shankar | H02J 3/14 700/148 |
| 9,740,227 | B2 * | 8/2017 | Forbes, Jr. | G05F 1/66 |
| 9,749,792 | B2 * | 8/2017 | Klicpera | G06Q 50/06 |

(Continued)

*Primary Examiner* — Haoshian Shih
*Assistant Examiner* — Alvaro R Calderon, IV
(74) *Attorney, Agent, or Firm* — Alleman Hall Creasman & Tuttle LLP

(57) ABSTRACT

Examples related to facilitating analysis of an electrical power system are disclosed. One disclosed example provides a device comprising a display, a processor, and a storage device storing instructions executable by the processor to receive a request to operate in first and second input/output modes. In the first mode, the instructions are executable to display a graphical representation of an electrical power system illustrating components and connectivities in a schematic view, and receive a user input specifying a selected component of a plurality of candidate components and also an associated connectivity. The instructions are executable to display the selected component in the graphical representation of the electrical power system and store the selected component and associated connectivity in a data structure. In the second mode, the instructions are executable to display a text-based representation of the distribution system organizing the components and connectivities in a tabular view.

19 Claims, 14 Drawing Sheets

(56) References Cited

U.S. PATENT DOCUMENTS

| | | | |
|---|---|---|---|
| 2004/0107025 A1* | 6/2004 | Ransom | G05B 19/4185 700/286 |
| 2004/0158360 A1* | 8/2004 | Garland, II | G06Q 50/06 700/286 |
| 2004/0236620 A1* | 11/2004 | Chauhan | G06Q 10/06 705/7.14 |
| 2008/0039979 A1* | 2/2008 | Bridges | B60L 11/1816 700/292 |
| 2008/0039980 A1* | 2/2008 | Pollack | B60L 11/1824 700/295 |
| 2008/0039989 A1* | 2/2008 | Pollack | B60L 11/1811 701/22 |
| 2008/0040223 A1* | 2/2008 | Bridges | B60L 11/1816 705/14.69 |
| 2008/0040295 A1* | 2/2008 | Kaplan | B60L 11/1816 705/412 |
| 2008/0040296 A1* | 2/2008 | Bridges | G01D 4/004 705/412 |
| 2008/0052145 A1* | 2/2008 | Kaplan | G06Q 10/0631 705/7.12 |
| 2009/0040029 A1* | 2/2009 | Bridges | G06Q 50/06 340/12.37 |
| 2009/0062970 A1* | 3/2009 | Forbes, Jr. | G01D 4/004 700/295 |
| 2009/0076726 A1* | 3/2009 | Gemignani, Jr. | G01C 23/005 701/469 |
| 2009/0083019 A1* | 3/2009 | Nasle | G06F 17/509 703/18 |
| 2009/0281673 A1* | 11/2009 | Taft | G01D 4/002 700/286 |
| 2009/0281674 A1* | 11/2009 | Taft | G01D 4/002 700/286 |
| 2010/0070909 A1* | 3/2010 | Biltz | G06F 17/5036 715/781 |
| 2010/0085376 A1* | 4/2010 | Nielsen | G06Q 10/06 345/589 |
| 2010/0086677 A1* | 4/2010 | Nielsen | G06Q 10/06 427/136 |
| 2010/0189887 A1* | 7/2010 | Nielsen | G06Q 10/06 427/136 |
| 2010/0306033 A1* | 12/2010 | Oved | G06Q 10/06375 705/7.37 |
| 2010/0332373 A1* | 12/2010 | Crabtree | G06Q 40/04 705/37 |
| 2011/0172841 A1* | 7/2011 | Forbes, Jr. | G01D 4/004 700/292 |
| 2012/0054124 A1* | 3/2012 | Rodrigues | G06Q 50/06 705/412 |
| 2012/0065944 A1* | 3/2012 | Nielsen | G06Q 10/103 703/1 |
| 2012/0221162 A1* | 8/2012 | Forbes, Jr. | G01D 4/004 700/295 |
| 2012/0239218 A1* | 9/2012 | Forbes, Jr. | G01D 4/004 700/295 |
| 2012/0253540 A1* | 10/2012 | Coyne | G06Q 10/00 700/297 |
| 2012/0271723 A1* | 10/2012 | Penilla | G06Q 20/18 705/16 |
| 2013/0061198 A1* | 3/2013 | Brier | G06F 3/0481 716/139 |
| 2013/0204450 A1* | 8/2013 | Kagan | H04L 67/06 700/291 |
| 2013/0205022 A1* | 8/2013 | Kagan | H04L 67/06 709/224 |
| 2014/0005851 A1* | 1/2014 | Frei | H04L 29/1249 700/295 |
| 2014/0039699 A1* | 2/2014 | Forbes, Jr. | G05B 19/02 700/286 |
| 2014/0114844 A1* | 4/2014 | Forbes, Jr. | G05D 17/00 705/39 |
| 2014/0178845 A1* | 6/2014 | Riesberg | G09B 23/181 434/301 |
| 2014/0226851 A1* | 8/2014 | Alberth, Jr. | G06Q 50/06 382/103 |
| 2014/0316958 A1* | 10/2014 | Alberth, Jr. | G06Q 10/00 705/35 |
| 2014/0379156 A1* | 12/2014 | Kamel | G05F 1/66 700/291 |
| 2015/0073609 A1* | 3/2015 | Forbes, Jr. | G05F 1/66 700/286 |
| 2015/0339901 A1* | 11/2015 | Shull | G08B 13/2462 340/572.1 |
| 2016/0034158 A1* | 2/2016 | Livesay | G05B 19/41835 715/736 |
| 2016/0034329 A1* | 2/2016 | Larson | G01D 21/02 702/188 |
| 2016/0042416 A1* | 2/2016 | Slowakowski | G06Q 10/06315 705/7.29 |
| 2016/0239342 A1* | 8/2016 | Miry | G06Q 10/0631 |
| 2016/0285416 A1* | 9/2016 | Tiwari | H02S 50/15 |
| 2016/0294635 A1* | 10/2016 | Nasle | H04L 41/22 |
| 2017/0048660 A1* | 2/2017 | Srinivasan | H04W 4/02 |

\* cited by examiner

FACILITATING ANALYSIS OF A ELECTRICAL POWER SYSTEM

BACKGROUND

Electrical power systems may span large areas and include a plurality of interconnected components. The configuration of the components, how the components are connected to one another, as well as the parameters of each individual component, may affect aspects of the electrical power system, such as arc flash risks posed by various locations within the electrical power system.

SUMMARY

Examples related to facilitating analysis of an electrical power system are disclosed. One disclosed example provides a device comprising a display, a processor, and a storage device storing instructions executable by the processor to receive a user request to operate in a first input/output mode and in a second input/output mode. In the first input/output mode, the instructions are executable to display a graphical representation of an electrical power system illustrating components and connectivities in a schematic view, display a user interface comprising a plurality of candidate electrical power system components, and receive a first user input specifying a selected component of the plurality of candidate electrical power component to include in the electrical power system and also a connectivity for the selected component. In response to the first user input, the instructions are executable to display the selected component in the graphical representation of the electrical power system and also store the selected component and the connectivity for the selected component in a data structure representing components and connectivities in the electrical power system. In the second input/output mode, the instructions are executable to display a text-based representation of the distribution system organizing the components and connectivities in a tabular view.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

In order to acquire data for modeling and analyzing an electrical power system, an evaluator may go on-site to survey the system. During the survey, the evaluator may take notes, pictures, and generate other information regarding components of the system and connectivities between components of the system. The evaluator may then later enter the notes into a computing system to generate a model of the electrical power system. Such a data acquisition process may be time-consuming, and also may be prone to error due to problems such as incomplete note-taking and/or poor organization of notes, sketches, and/or photos. Such error may cause difficulties in modeling the electrical power system off-site, or even prevent the user from modeling the system until the user returns to the site to collect corrected or additional data. Furthermore, if the user does not gather all of the information for the electrical power system before leaving the site, the user may not be aware of the missing information used for subsequent analysis until later generating the model off-site, which may result in inconvenient return trips to the site.

Accordingly, examples are disclosed that relate to systems and methods for the on-site gathering and verification of information for electrical power system modeling. Briefly, the disclosed examples provide for multiple user interfaces to allow electrical power system components and connectivity data to be input and displayed in different manners while performing a survey on-site. By updating and reading from a common data structure (e.g., a directed graph with nodes and connectivities representing power system components and conductors) in each input/output mode, a user may model and view the modeled system in a manner that is most appropriate for the user and/or the type of information being input/presented. This may permit different visualizations of and user interactions with an electrical power system model, both during construction of the model and after completion of the model. Further, the disclosed examples also provide for the validation of the model so that any gaps in data needed for modeling the electrical power system (e.g. for arc flash hazard analysis) can be identified while still on-site. This may help to avoid problems that arise when performing a more detailed off-site analysis if necessary data is not gathered. These examples and others are described in more detail below.

Figure 1A:
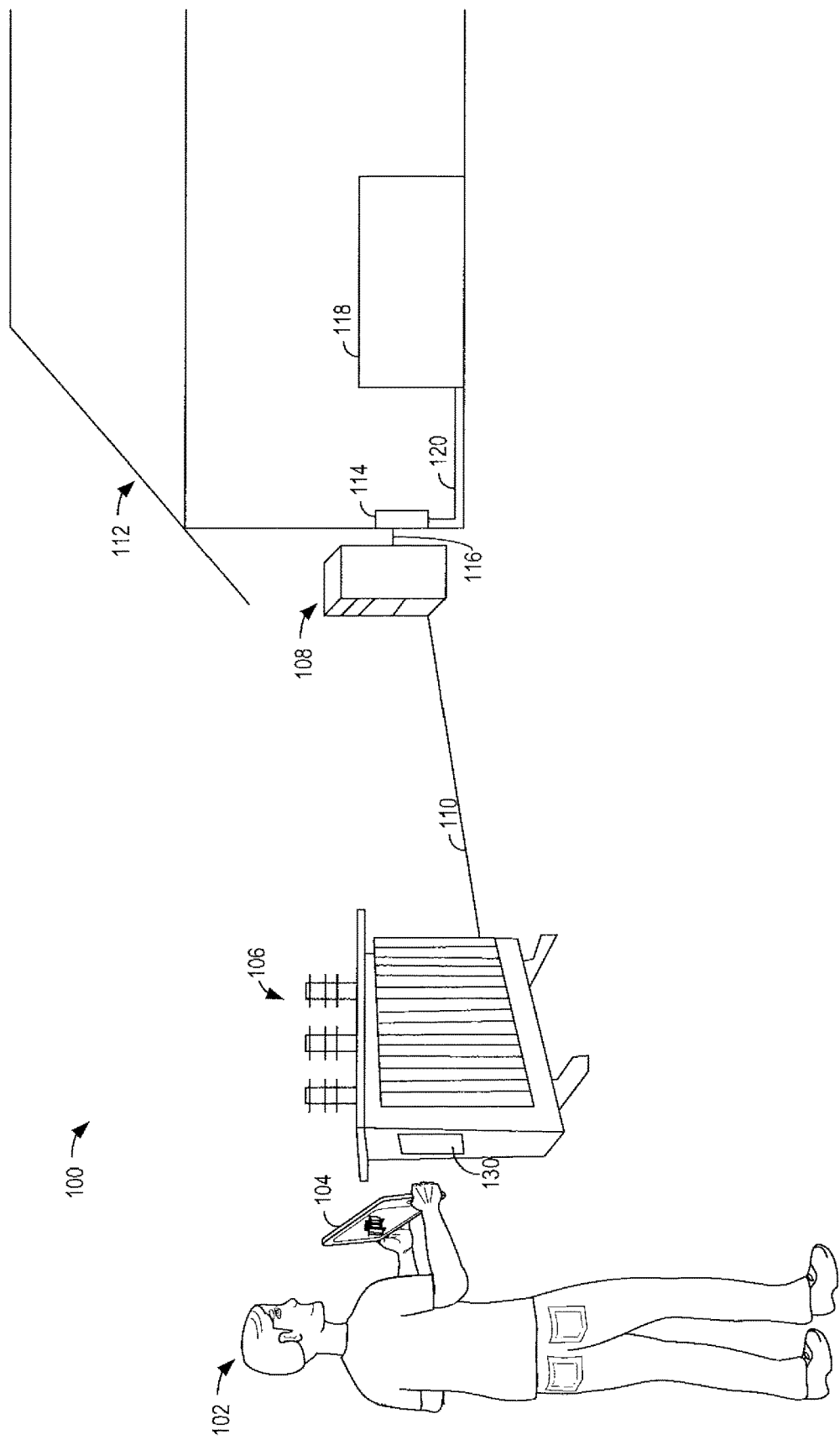
FIG. 1A shows an example electrical power system analysis environment.

FIG. 1A shows an example scenario in which a user 102 is performing an on-site survey of an electrical power system 100. As depicted, the user 102 is carrying a mobile computing device 104 with which the user may enter information components and connectivities of the electrical power system using a mobile computing device 104. While depicted as a tablet computing device, it will be understood that any other suitable portable device may be used. Examples of other suitable portable computing devices include, but are not limited to, smart phones and laptop computers. The electrical power system 100 includes a plurality of components connected to one another via one or more conductors.

For example, a transformer 106 is connected to a switchgear 108 via a conductor 110 in order to supply utility power to a commercial building 112. The switchgear 108 is connected to a panel 114 (e.g., a circuit breaker panel) via a second conductor 116. A load device 118 (e.g., a machine operating in commercial building 112) is powered by the utility power via a connection to panel 114 through a third conductor 120. Other components may be present between the illustrated components, but are absent from the figure for illustrative purposes. It is to be understood the depicted electrical power system is shown for the purpose of example, and that any other suitable electrical power system may be surveyed and analyzed via the disclosed examples.

Figure 1B:
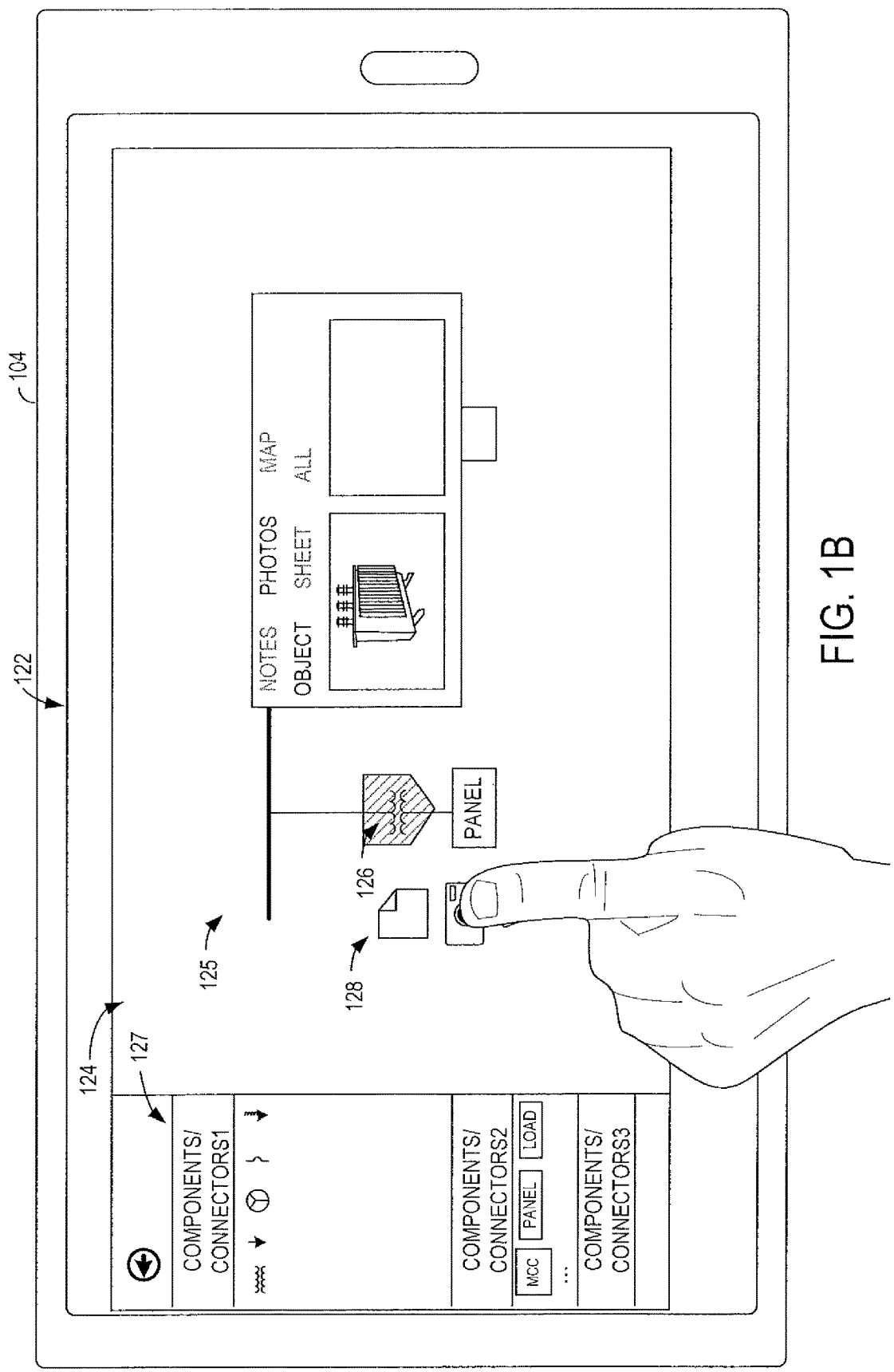
FIG. 1B shows an example user interface for entering information regarding the example electrical power system analysis environment of FIG. 1A.

To document the electrical power system, the user 102 may perform a walkthrough of the system, entering information about each component in the electrical power system 100 via mobile computing device 104 while visually inspecting the component. As mentioned above, various different input/output modes may be provided for entering and displaying information regarding the electrical power system 100. One such input mode is illustrated in FIG. 1B, which shows a user interface 124 displayed on a display 122 of the mobile computing device 104. In this mode, the user interface 124 depicts a schematic view 125 of a model of the electrical power system. With this user interface, components of the electrical power system may be added by selecting the components from a list of candidate components 127 and dragging/dropping the components via the user interface 124 into desired locations within the schematic view.

Further, once a component has been added to the model of the electrical power system, various metadata regarding the component may be entered. For example, a graphical representation 126 of transformer 106 may be selected to display a menu 128 of metadata input controls for the transformer. FIG. 1B illustrates a photograph input control being selected from menu 128. When selected, this control may allow the user to take a photograph of the component with an on-board camera of the portable computing device 104 and store the photograph as metadata associated with the transformer 126. The photograph may then be accessed for later reference, e.g. to find electrical parameter information appearing on a descriptive plate attached to the component, to inspect the component for damage, and for other information. Each added component representation and/or connectivity may be input into a shared data structure. In some examples, the shared data structure may be a directed graph including nodes and connectivities representing electrical power system components and conductors. Additional information entered for selected components/conductors and/or for the modeled system may be added to the data structure as metadata.

In some examples, the photograph may be further processed by the portable computing device 104 or another computing device that receives the photograph from the portable computing device 104. For example, object recognition processes may be performed to identify the component and/or determine parameters or device settings of the component without manual user input. As a more specific example, a user may capture a photo of a descriptive plate on the component, such as plate 130 of FIG. 1A. The computing system may recognize characters, symbols, or other visual features on the plate in order to identify one or more parameters provided on the plate such as manufacturer, model name/number, and serial number and/or device settings such as breaker trip points. Any automatically identified information may be presented to a user for confirmation as metadata, or automatically added as metadata for the component without confirmation. The automatically identified information may be added to the metadata or other associated data for the node of the data structure that represents the analyzed component (e.g., transformer 106 in the illustrated example).

Figure 2:
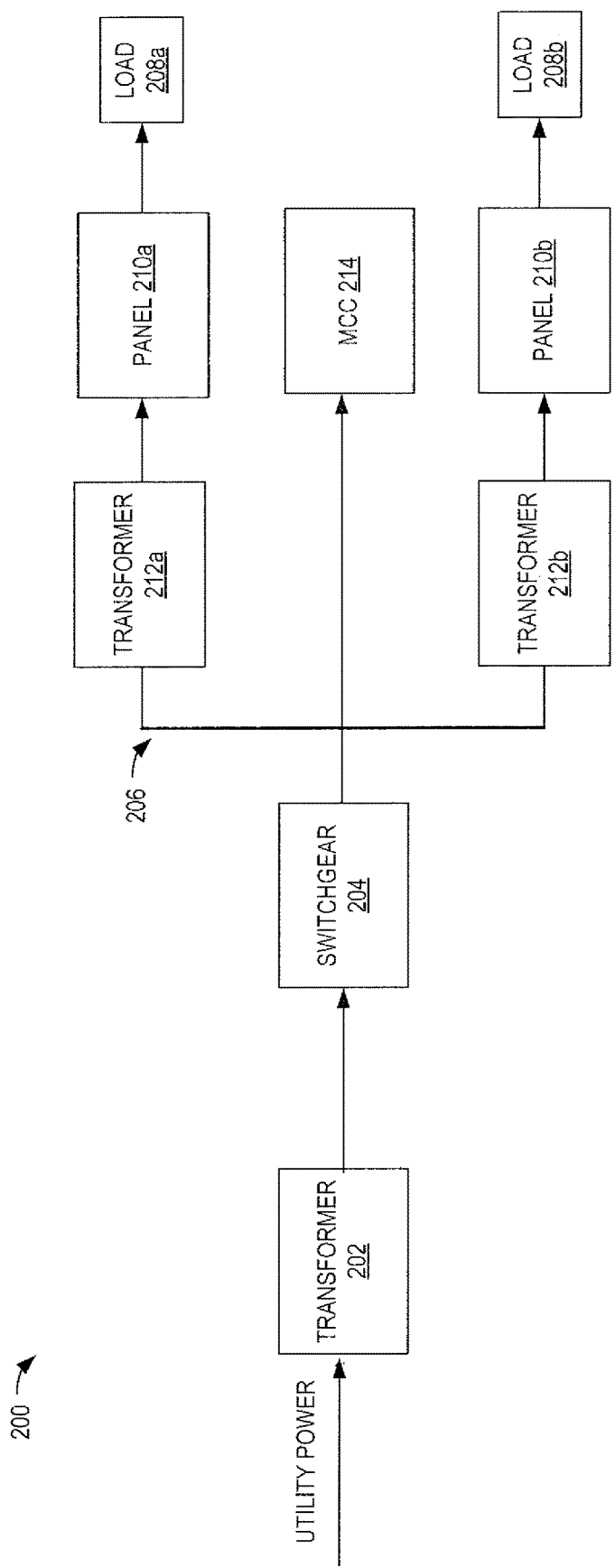
FIG. 2 is a block diagram of an example electrical power system.

FIG. 2 shows a block diagram of an example electrical power system 200. As depicted, utility power is provided to a transformer 202, for example, to reduce the voltage of the utility power to a level that is more suitable to be distributed to a load, such as a specific machine or a building containing multiple loads. The stepped-down voltage from the transformer is provided to a switchgear 204 for controlling and protecting the loads. The switchgear 204 may include components such as circuit breakers for distribution circuits in order to protect the connected circuits from overloading conditions. The switchgear is connected to a bus 206 that provides power to a plurality of lines and associated loads. For example, loads 208a and 208b may include equipment in the commercial environment, each of which may be connected to a corresponding local panel 210a and 210b via a respective transformer 212a and 212b. In another path, the switchgear may be connected to a motor control center (MCC) 214. It will be understood that these paths are illustrated for the purpose of example and are not intended to be limiting in any manner.

Figure 3:
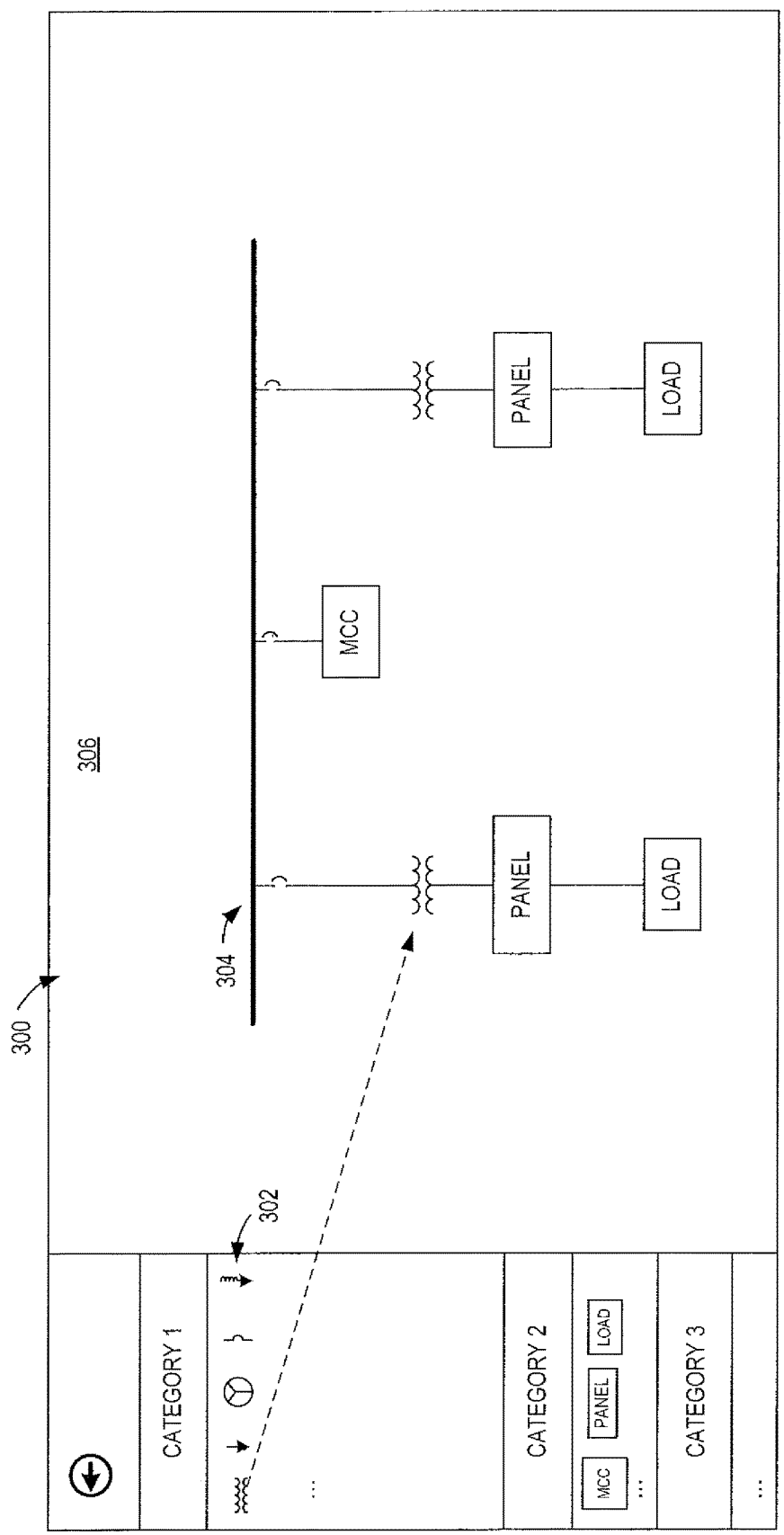
FIG. 3 illustrates an example user interface for a graphical input/output mode.

FIG. 3 shows an example user interface 300 for the electrical power system 200. Similar to FIG. 1B, the user interface 300 shows a schematic representation of a model of the electrical power system 200. Each component of the electrical power system 200 is represented by a corresponding graphical representation (e.g. an icon) in the user interface 300. Also, graphical representations of candidate components 302 are presented in a menu for selection by a user. The candidate components may be organized into different selectable categories in order to assist a user in finding a desired component for inclusion in the model of the electrical power system 200. As mentioned above, in order to add a candidate graphical representation to a model or representation 304 of the electrical power system, a user may select and/or drag a selected candidate graphical representation to a region 306 of the user interface in which the electrical power system model is displayed, and drop the candidate graphical representation into place in the model. Other user input modes other than drag/drop also may be used. Upon placement, the component added by the user also is added to the data structure representing the electrical power system 200. The user further may specify one or more connectivities of the component by selecting a connector from the list of candidate graphical representations and placing the connector in between the component representation and a connected component or bus representation. The user may resize and/or otherwise adjust the connector in order to fit the connector in between the connected components/buses. If the user does not add a specified conductor, a default conductor may be added, or the connectivity may be left open, which may trigger an alert in a validation process (as described below).

Figure 4:
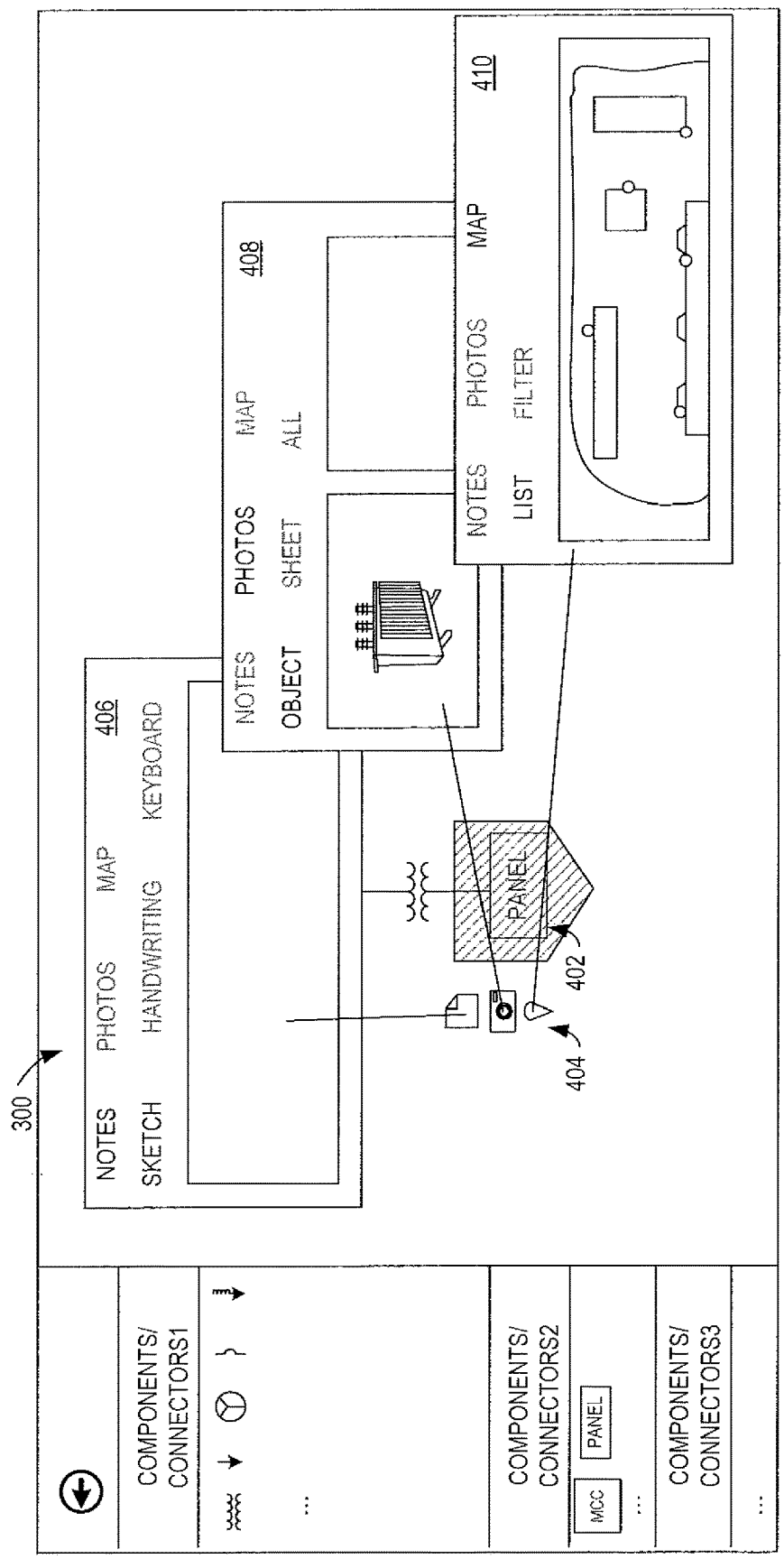
FIG. 4 illustrates another example user interface for a graphical input/output mode.

FIG. 4 shows examples of different metadata input fields for the user interface 300. Upon selecting an icon 402 representing a component (e.g. panel 210a of FIG. 2), a plurality of menu options 404 may be presented to allow a user to enter metadata parameters and/or equipment device settings for the component. As one example, an icon in the form of a sheet of paper may be selected to open a notes entry field 406 to allow a user to enter notes regarding the selected component. Notes may be entered in any suitable manner, such as by making sketches, writing, or the like via a finger or stylus input to a touch pad, by providing text entry via a keyboard (e.g., a hardware or software keyboard integrated with/connected to the device displaying the user interface), or in any other suitable manner. In some examples, selecting the keyboard entry option of the notes window 406 may cause a software keyboard to be displayed in the user interface to allow the user to enter text-based notes. Handwritten notes and/or sketches may be provided as standalone notes/sketches and/or provided as an overlay annotation on a photograph of a component, as described in more detail below.

As another example, an icon in the form of a camera may be selected to allow a user to add photos relating to the component via a photograph entry field 408. The photograph entry field 408 may allow a user to automatically add photographs of the component (or any other desired photographs) to the data structure entry for that component by simply taking a picture with an onboard camera. For example, a photograph of an information plate on a component, such as plate 130 of FIG. 1A, may be stored for the component. Previously-acquired photographs also may be imported into the data structure representing the power system using the photograph entry field 408. Further, as mentioned above, in some examples additional processing may be performed on the photographs to identify objects and/or extract information from the photographs, such as component information extracted from plate 130. A user may additionally annotate the photograph in some examples, by inputting handwritten (e.g., via input to a touch sensor via a stylus, finger, or other input device) or typed (e.g., via a software or hardware keyboard) text and/or by sketching on the photograph (e.g., via input to a touch sensor via a stylus, finger, or other input device).

As another example of a metadata input field, FIG. 4 shows a pin icon selectable to open a map window 410 that allow as user to view and/or add information to a map of the electrical power system and/or surrounding regions displayed in the map window 410. The map may be generated based on data from a Global Positioning System (GPS) sensor or other sensor of the computing device presenting the user interface and/or a connected computing device, potentially in combination with previously-known information regarding the layout of the power-distribution system. In additional or alternative examples, the layout of the electrical power system may be derived from an existing modeling file (e.g., a two-dimensional Computer-Aided Design [CAD] file of the layout of all or a portion of the electrical power system facility) that is uploaded, transmitted, and/or otherwise input to the computing device. The modeling file may depict the electrical power system having a known scale, such that the computing device may identify components in the electrical power system schematic (e.g., generated at the computing device) relative to the known layout in the modeling file to determine distances between components.

In the depicted example, locations of modeled components of the electrical power system are indicated on the map as circles in the approximate locations of the components, but may take any other suitable form. Using the map window 410, a user may enter a location for a component shown in the schematic view by tapping a location of the map for that component, by obtaining GPS coordinates from an on-board GPS sensor, or in any other suitable manner. Further, the user may select various filters on the map in order to view components and/or conductors (e.g. component type, location, etc.) having properties meeting the filter parameters.

Other metadata obtained via sensors also may be stored for components and/or conductors. For example, the mobile computing device (or a connected device) may include a radiofrequency identifier (RFID) scanner that may read RFID tags located in/on the components of the electrical power system. Information stored in the RFID tags may be automatically added as metadata for a component in the electrical power system model.

Figure 5A:
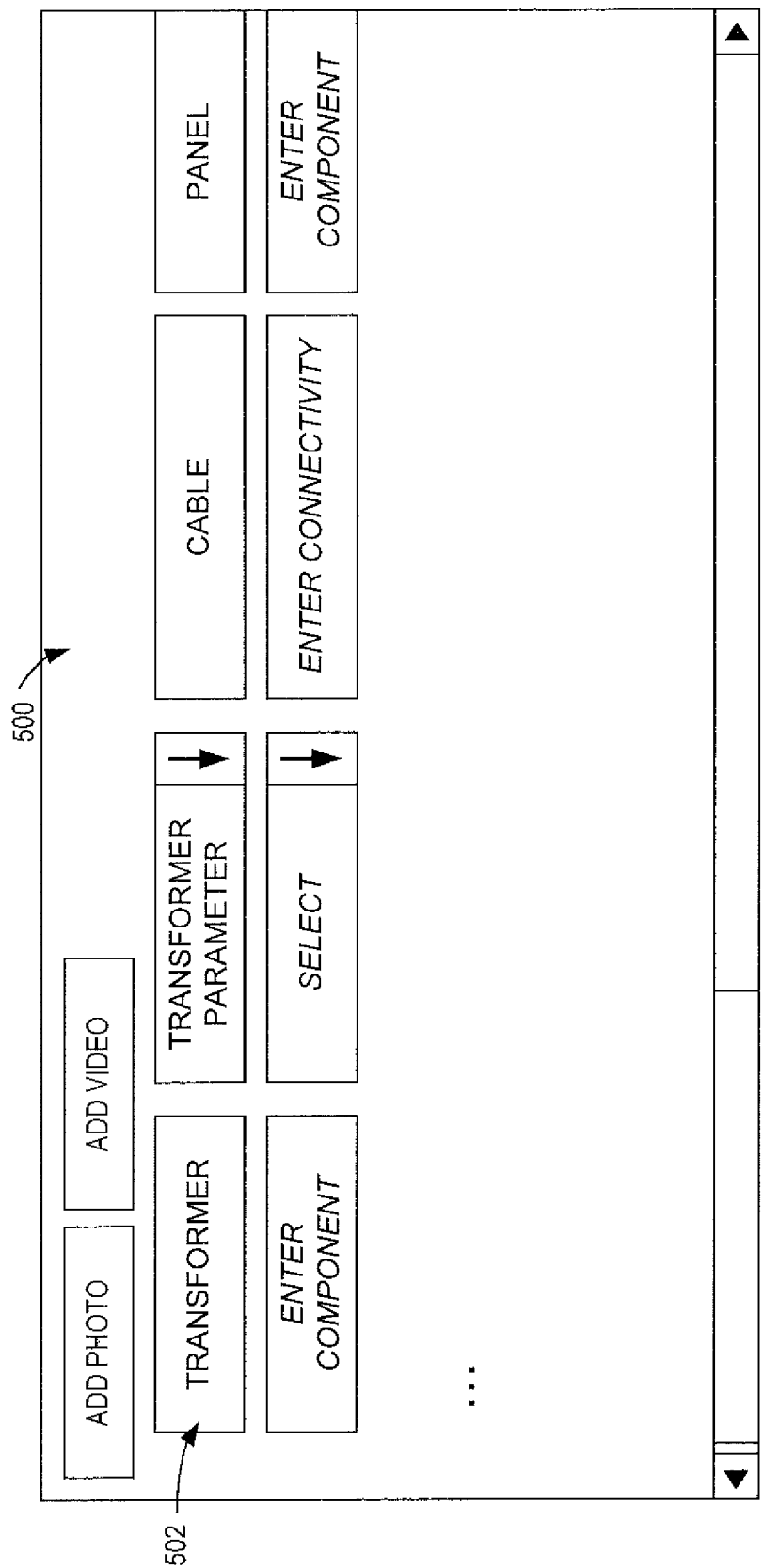
FIGS. 5A and 5B illustrate an example user interface for a tabular input/output mode.
Figure 5B:
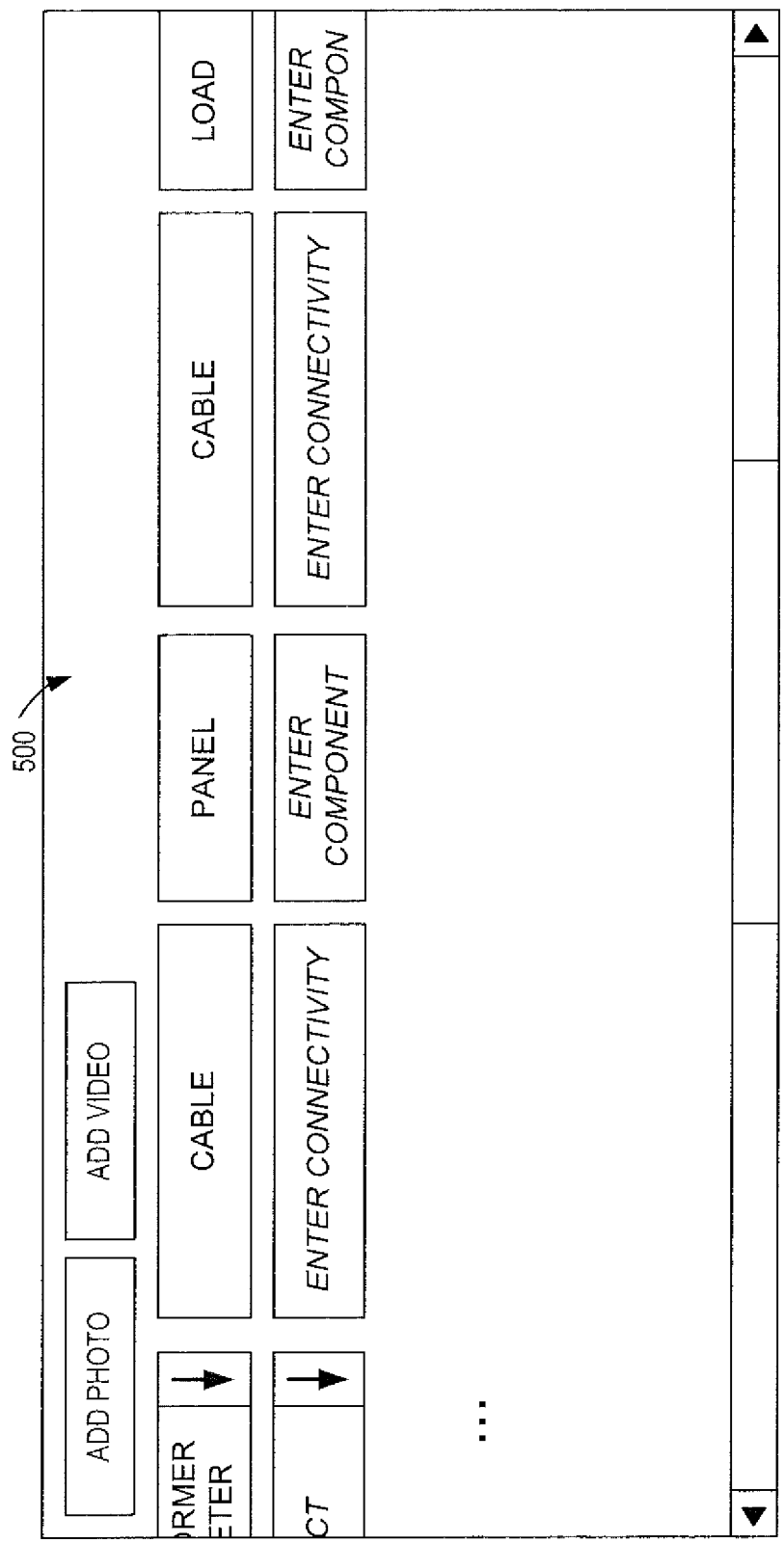

FIGS. 5A and 5B show a second example user interface 500, and illustrate a tabular input/output mode. The depicted tabular input/output mode provides cell- and/or text-based representations of components in the modeled electrical power system. Each connected line of components (e.g., originating from a common bus) may be represented by a row of cells in the user interface. For example, as shown in FIG. 5A and continued in FIG. 5B, the first row of cells 502 may include cells for the transformer, cable (conductor), panel, cable (conductor), and load illustrated in the graphical input/output mode shown in FIG. 3. The second row of cells illustrate prompts to enter information about a connected line of components. For example, a component may be entered (e.g., text input via a hardware or software keyboard, handwritten via a touch pad, and/or voice recorded via a microphone) into a first cell of the row. One or more parameters and/or device settings may be added by selecting the parameter/setting and/or parameter/setting value from a drop-down menu. Other selection/entry mechanisms may be used in the tabular input/output mode, such as radial buttons, check boxes, etc.

As discussed above with respect to the graphical input/output mode, additional information about components/connectivities may be added via photos, videos, and/or other entry features. Accordingly, respective user interface elements may be provided to allow such information to be added. Further, the different user input/output modes may receive inputs to and provide outputs of a common data structure. For example, components and connectivities shown in the graphical schematic view of the first input/output mode along a common line may be represented in the text- or cell-based view of the input/output mode by cells extending in a common direction.

Figure 6A:
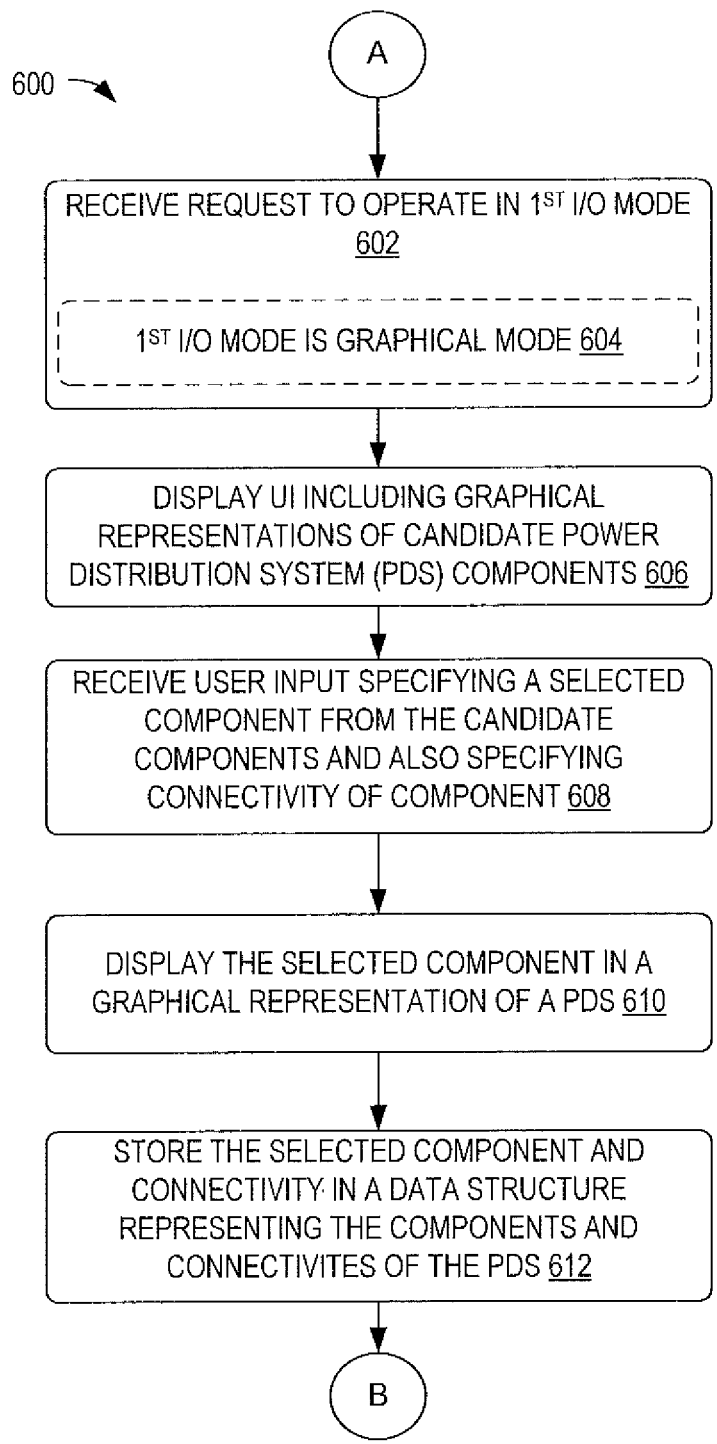
FIGS. 6A and 6B show a flow diagram illustrating an example method of acquiring data for constructing an electrical power system model.
Figure 6B:
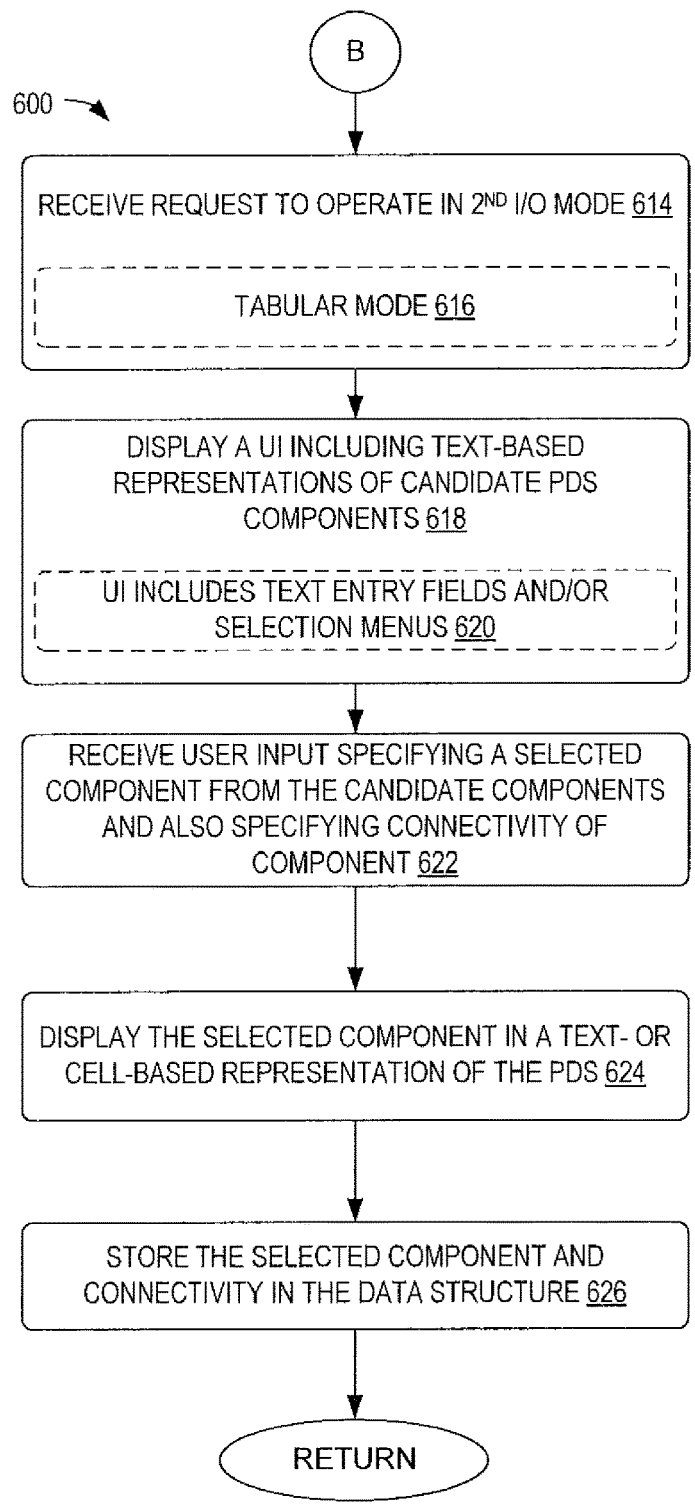

FIGS. 6A and 6B show flow diagrams illustrating an example method 600 for operating a computing device in different input/output modes to build and display a model of an electrical power system. First referring to FIG. 6A, the method includes receiving a request to operate in a first input/output mode, as indicated at 602. The first input/output mode may be a graphical mode, for example, that displays an electrical power system in schematic form, as indicated at 604. At 606, the method includes, while operating in the first input/output mode, displaying a user interface including graphical representations of candidate electrical power system components. FIGS. 3 and 4 are examples of user interface that illustrate a graphical input/output mode.

At 608, the method includes receiving a user input specifying a selected component from candidate components and also specifying connectivity of the selected component (e.g., a conductor connecting the component to another component). At 610, the method includes displaying the selected component in the graphical representation of an electrical power system. The method further includes storing the selected component and connectivity in a data structure representing the components and conductors/connectivities of the electrical power system, as indicated at 612.

After updating the data structure to include inputs made in the first input/output mode, and next referring to FIG. 6B, the method may include receiving a request to operate in a second, different, input/output mode. For example, the second input/output mode may be a tabular mode, as indicated at 616. At 618, the method includes, while operating in the second input/output mode, displaying a user interface including text- or cell-based representations of candidate electrical power system components. For example, the user interface may include text entry fields and/or selection menus (e.g., drop-down menus, radial buttons, check boxes, and/or other selection menus), as indicated at 620. An example tabular mode of the user interface is illustrated in FIGS. 5A and 5B.

At 622, the method includes receiving a user input specifying a selected component from the candidate components and also specifying conductors/connectivities for the selected component. At 624, the method includes displaying the selected component in a text- or cell-based representation of the electrical power system. The method further includes storing the selected component and connectivity in the data structure, as indicated at 626. The method may then return, either to continue receiving updates to the representation of the electrical power system, or to switch input/output modes (e.g., return to "A" of FIG. 6A). In this way, inputs made via either of the input/output modes are saved to the same data structure. When displaying the representation of the electrical power system in either mode, the information for the components and connectivities may be retrieved from that data structure, such that inputs made in one input/output mode may be viewable when displaying the representation of the electrical power system in another input/output mode. In some examples, the data structure may be a shared directed graph of nodes and connectivities that is accessible from each input/output mode.

It is to be understood that the input/output modes and associated views described herein are exemplary in nature, and any other suitable input/output mode and associated view may be used to model the electrical power system. For example, an elevation view may be presented as another input/output mode in which components of the modeled electrical power system are displayed in a realistic and/or scaled representation of the actual components and conductors of the system. In such an elevation view, connections between components may be spatially arranged in a similar relation relative to the real-world counterparts. For example, a single circuit breaker panel may be electrically connected to multiple components via multiple conductors. In the elevation view, each conductor may be depicted as connecting to the circuit breaker at a different location, relating to the real-world/actual location where the conductor is coupled to the circuit breaker. In some examples, the elevation view may be a representation three-dimensional real-world objects (e.g., a switchgear, a breaker panel, etc.) that appears to be three-dimensional, even when viewed on a two-dimensional display (e.g., a three-dimensional model represented in two-dimensions, where modeled components have an appearance based on the associated real-world components). As described above with the schematic and tabular views, inputs/outputs to/from the elevation view and/or any other suitable view may be made to/read from the same data structure to allow seamless switching between input/output modes.

Figure 7:
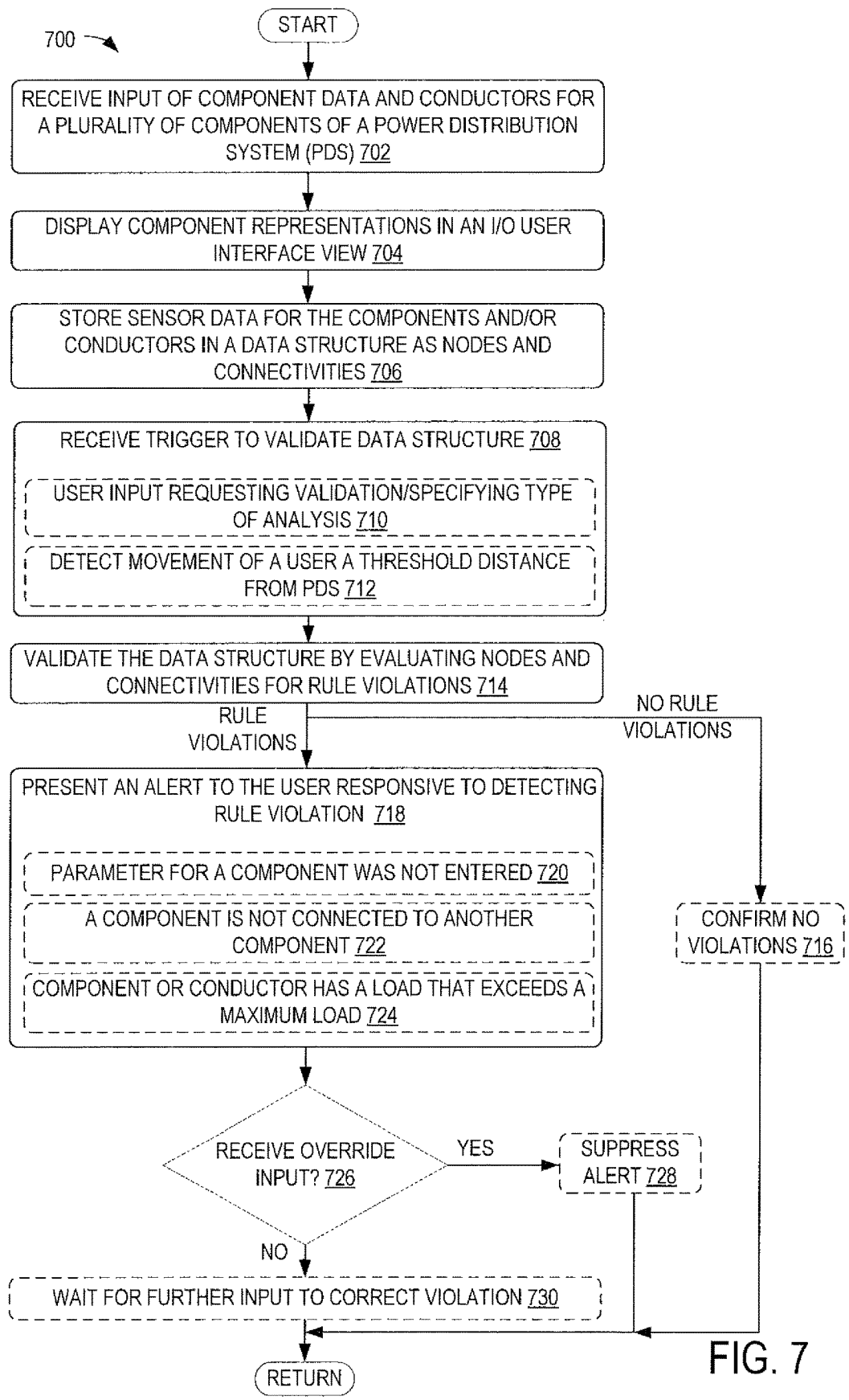
FIG. 7 is a flow chart of an example method of performing gap analysis on an electrical power system model.

As mentioned above, where an evaluator is performing an on-side evaluation of an electrical power system, there is a risk that some data to be used for modeling the electrical power system may be erroneously missed. Where this is discovered at a later time, after the evaluator has left the site, it may be difficult to obtain the missed data. As such, a validation process may be performed on the data entered while the evaluator is still on site. In this manner, any data identified as missing may be collected prior to going off-site. FIG. 7 shows a flow diagram illustrating a method 700 for performing gap analysis on data acquired for electrical power system modeling, wherein the term "gap analysis" refers to the identification of any missing data. At 702, the method includes receiving an input of component data and conductors/connectivities for a plurality of components of an electrical power system, and at 704, displaying component and/or conductor/connectivity representations in an input/output user interface view, such as those described above. The method includes storing sensor data for the components and/or conductors in a data structure, for example, as a directed graph having nodes and connectivities, as indicated at 706.

At 708, the method includes receiving a trigger to validate the data structure. Any suitable trigger may be used. For example, as indicated at 710, the trigger may take the form of a user input requesting the validation. The user input may also specify and/or otherwise identify the type of analysis that the user is requesting to perform. For example, the input requirements for an arc flash analysis may be different from a power flow analysis. In additional or alternative examples, the trigger may be automatic without user input, such as detecting movement of a user a threshold distance away from the electrical power system, as indicated at 712. Such a distance threshold may be used to determine if the user is moving off-site. Other automatic triggers also may be used, such as time-based triggers (e.g. time elapsed since a last user input, a last validation, and/or other event) and interaction-based triggers (e.g. detecting that a threshold number of components/connectivities have been input).

In response to receiving the trigger, the method includes validating the data structure by evaluating nodes and connectivities for rule violations, as indicated at 714. Any suitable rules may be evaluated. Examples include, but are not limited to, required connectivities for components and/or required metadata for components. If no rule violations are found, the method may return to continue receiving or waiting to receive inputs of components and conductors. In some examples, a confirmation that no violations were detected may be output, as indicated at 716.

If one or more rule violations are found, the method includes, at 718, presenting an alert to the user in response to detecting the alert. Example rule violations may include detecting that a parameter and/or device setting for a component was not entered, as indicated at 720, detecting that a component is not connected to another component, as indicated at 722, and/or detecting that a component or conductor has a load that exceeds a maximum load, as indicated at 724. The above-described rule violations are presented for example, and any other suitable rule may be evaluated for violations.

At 726, the method may include determining whether an override input was received. In some examples, a user may be permitted to override a rule violation warning in order to continue modeling/analysis. If an override input is detected, then the method includes, at 728, suppressing the alert (for example, close a user interface window presenting the alert, ceasing an audio alert, etc.). If an override input is not detected, the method proceeds to 730 to wait for further input to correct the violation (e.g., the addition of connections between components, the addition/modification of parameters/device settings of components, the deletion of components, etc.). While waiting, the system may continue presenting the alert, or may present the alert for a threshold period of time.

Figure 8A:
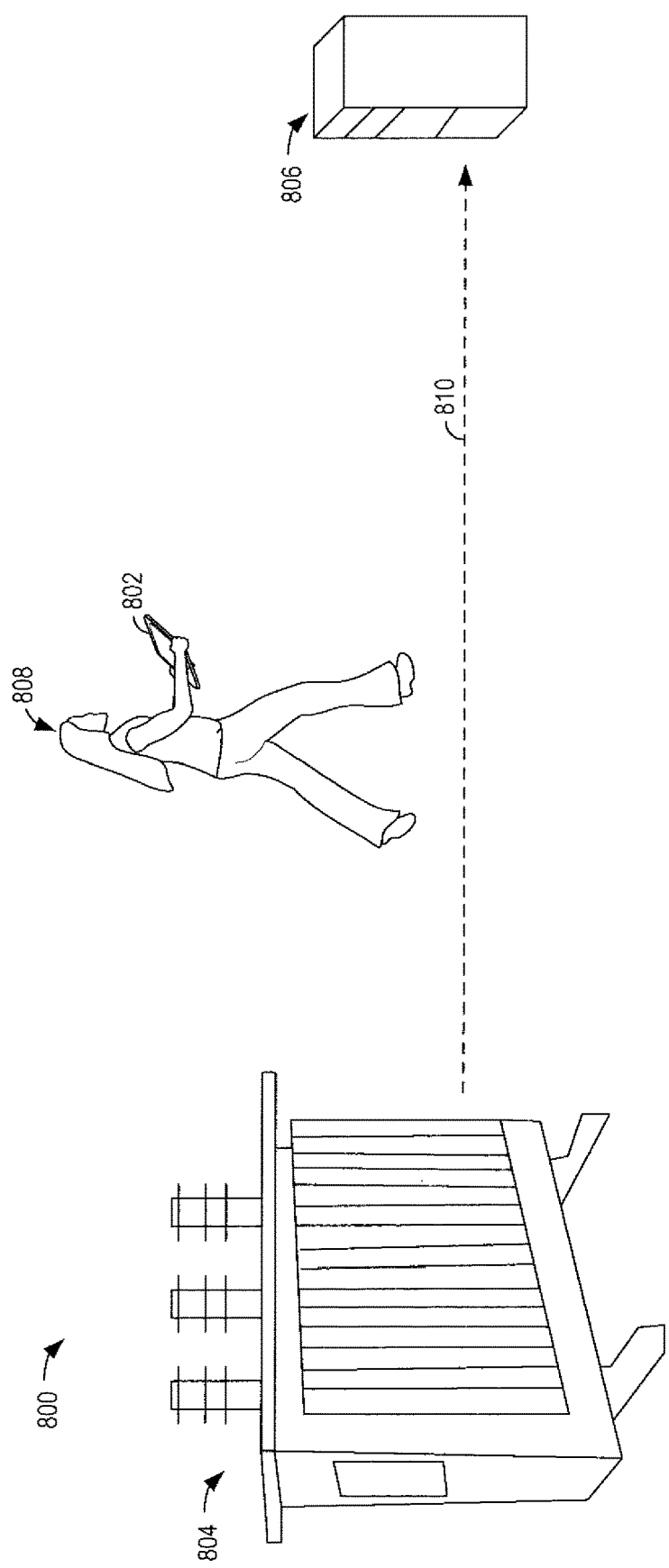
FIGS. 8A-8C show an example method of tracing connections between components of an electrical power system.
Figure 8B:
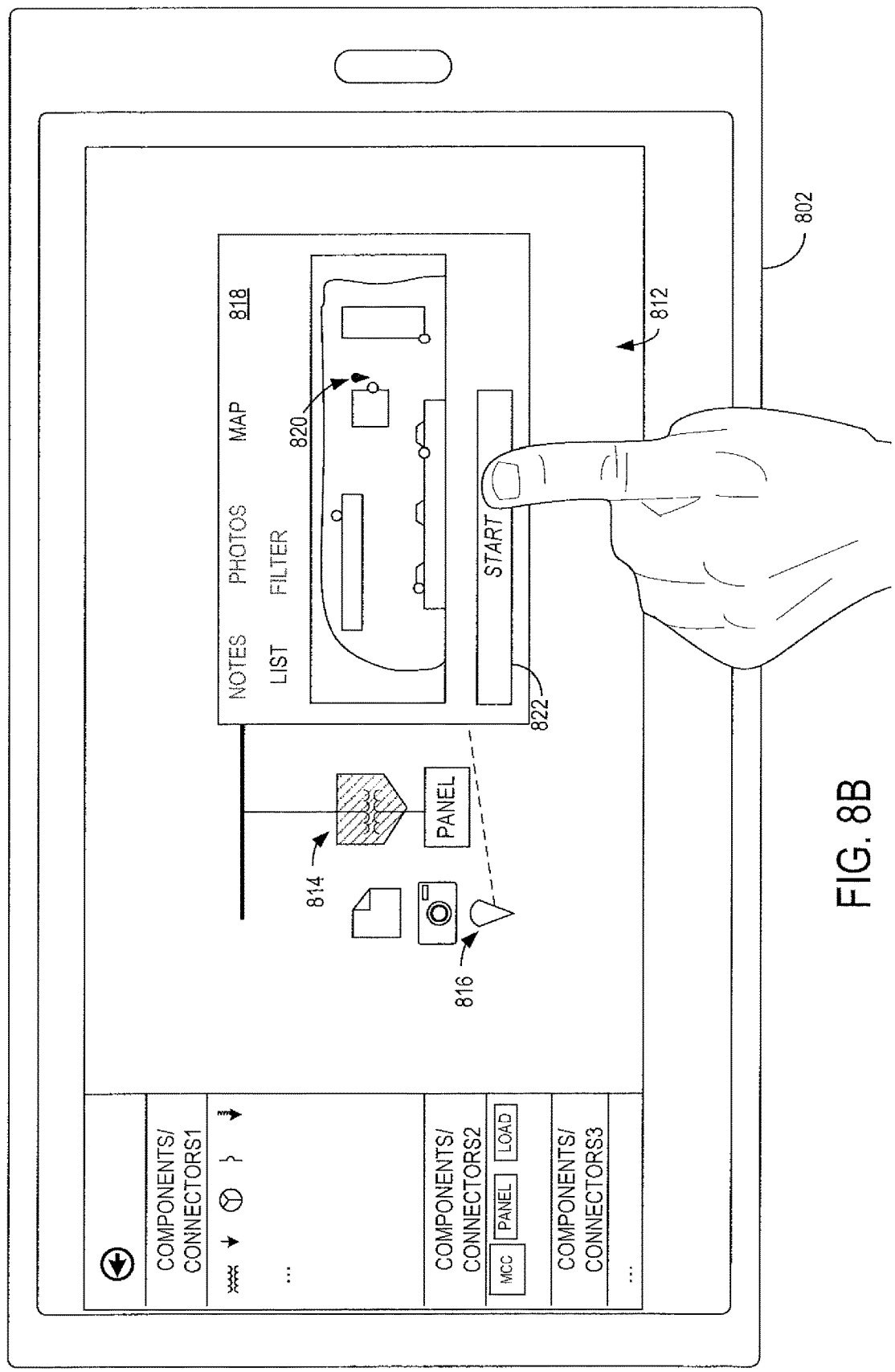
Figure 8C:
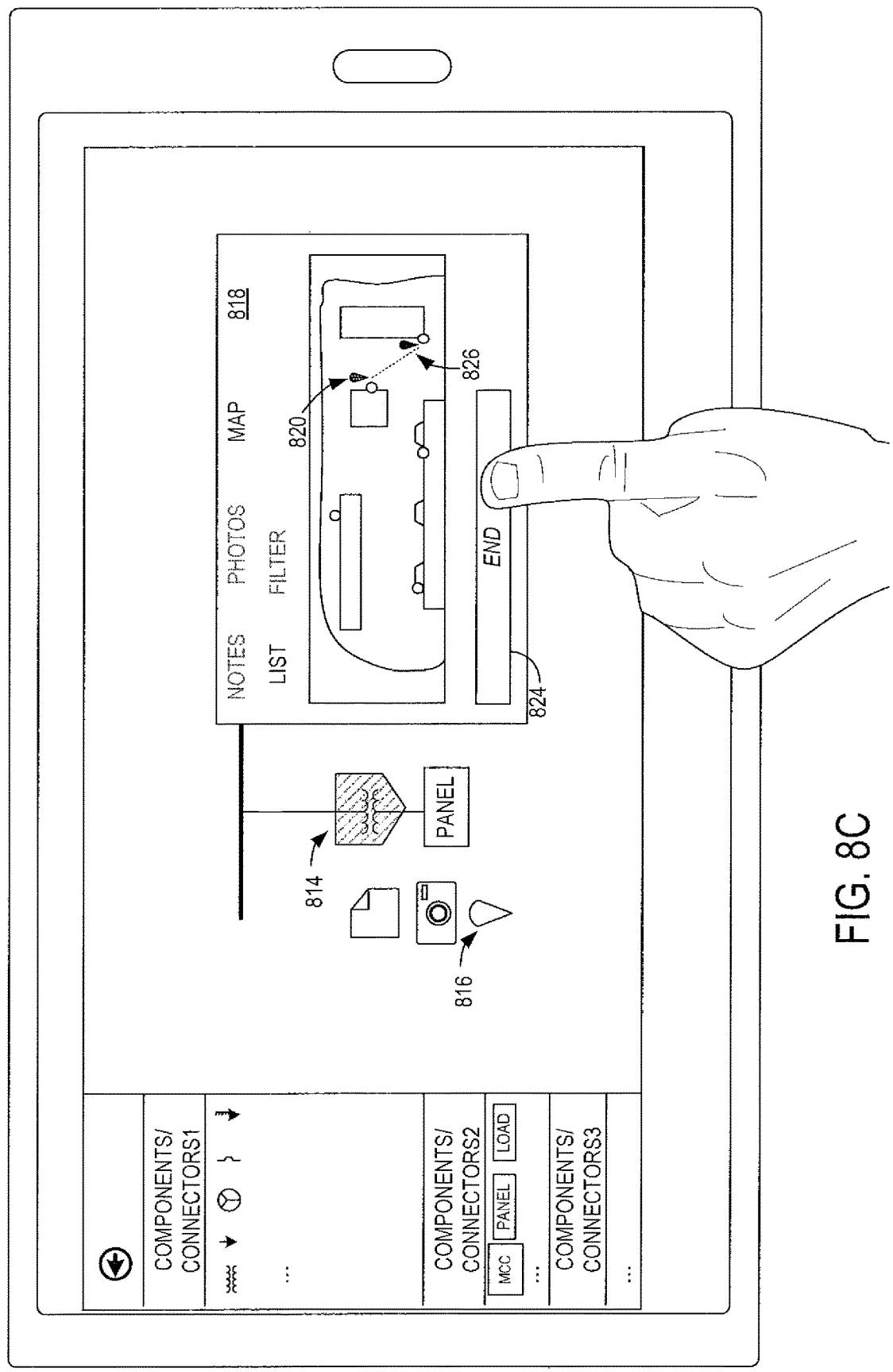

Various analyses of electrical power systems, such as arc flash hazard analyses, may utilize conductor lengths, distances between component, and/or other such distance-based data as inputs. As such, FIGS. 8A-8C illustrate a process for automatically tracing a conductor between components and determining or estimating the length of the conductor using sensors of a mobile device 802. As illustrated in FIG. 8A, an example electrical power system 800 includes a first component 804 (e.g., a transformer) and a second component 806 (e.g., a switchgear). A user 808 may enter information regarding the first component 804 using mobile device 802, for example, according to method 600 of FIGS. 6A and 6B. After entering the information, the user may travel along a path 810 of a conductor connecting the first component 804 to the second component 806. In this example, the user may determine a length of this path by first selecting a graphical representation 814 of the first component, and then selecting a mapping entry control 816 to display a mapping window 818 illustrating at least a portion of the electrical power system being modeled. A location indicator 820 may indicate a current location of the mobile device 802/user 808, as determined by a local GPS or similar locating sensor (e.g., included in and/or communicatively connected to the mobile device).

Upon selecting a user interface element to begin tracing a conductor path (e.g., start button 822), the mobile device 802 may set the location indicated by the location indicator 820 as a start point on the map, and track a path traversed by the user 808 using GPS data. When the user has arrived at the second component, the user may select an "end" user interface control, shown at 824 in FIG. 8C. Upon selection of this control mobile device 802 may calculate a length of the conductor based on the path travelled and automatically enter the determined length into a length parameter field for the conductor connecting the first component to the second component in the model of the electrical power system (e.g., into a data structure representing the electrical power system), either with or without user confirmation.

In another example, the length of one or more of the conductors in an electrical power system may be determined based on input derived and/or received from an external or integrated device including an infrared or other suitable sensor to measure distance. In examples where the infrared or other sensor is an external device, the external device may be equipped with a transmitter and/or transceiver configured to send an indication of the measured distance to the computing device automatically (e.g., upon determining a measurement) or responsive to user input (e.g., approving a measurement). Upon receipt of the measured distance, the computing device may input the distance into the model of the electrical power system (e.g., in association with a conductor that is selected by the user and/or automatically determined, such as based on a determined location of the computing device and the conductor).

The above-described systems and methods may assist a user in modeling an electrical power system using different input/output methods, thereby allowing the user to select the input/output method that is most appropriate for the user and/or a type of information being input/output. By automating some parameter entry and gap analysis, the user may more easily complete and verify an accurate model of the electrical power system before leaving the site, thereby reducing the need for repeated trips to the site or other follow-up surveys to collect further information. The automatic detection of parameters, such as conductor lengths, component details presented on the component itself (e.g., via a plate on the component), and locations of components, reduces the possibility of user input error and eases the burden of parameter entry on the user. Each of these features may provide for a user-friendly and precise electrical power system modeling and analysis experience using the methods and systems described herein.

The examples described herein may be tied to a computing system of one or more computing devices. In particular, such examples may be implemented as a computer-application program or service, an application-programming interface (API), a library, and/or other computer-program product.

Figure 9:
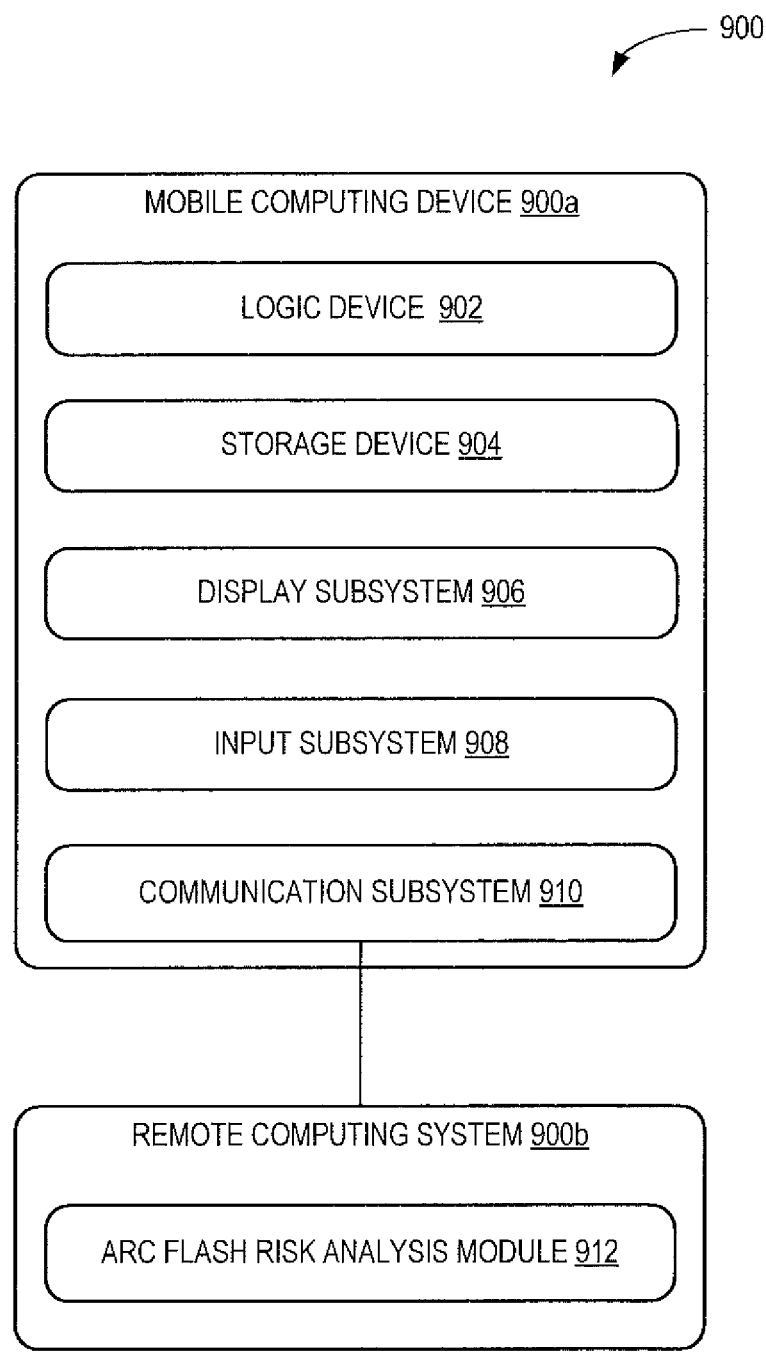
FIG. 9 is a block diagram of an example computing environment.

FIG. 9 schematically shows a non-limiting embodiment of a computing system 900 including a mobile computing device 900a and a remote computing system 900b that can enact one or more of the methods and processes described above. Computing system 900 is shown in simplified form. Computing system 900 may take the form of one or more mobile computing devices, tablet computers, mobile communication devices (e.g., smart phone), personal computers, server computers, home-entertainment computers, network computing devices, gaming devices, and/or other computing devices. In one non-limiting example, mobile computing device 900a may include a tablet, laptop, and/or smart phone, and remote computing system may include a cloud-based/networked server computer system and/or desktop computing device.

Mobile computing system 900a includes a logic device 902 and a storage device 904. Mobile computing system 900a may optionally include a display subsystem 906, input subsystem 908, communication subsystem 910, and/or other components not shown in FIG. 9. Remote computing system 900b may include one or more of the components of mobile computing device 900a in addition to an arc flash risk analysis module 912 for performing off-board risk analysis for an electrical power system modeled using mobile computing device 900a (e.g., in accordance with method 700 of FIG. 7.

Logic device 902 includes one or more physical devices configured to execute instructions. For example, the logic device may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic device may include one or more processors configured to execute software instructions. Additionally or alternatively, the logic device may include one or more hardware or firmware logic devices configured to execute hardware or firmware instructions. Processors of the logic device may be single-core or multi-core, and the instructions executed thereon may be configured for sequential, parallel, and/or distributed processing. Individual components of the logic device optionally may be distributed among two or more separate devices, which may be remotely located and/or configured for coordinated processing. Aspects of the logic device may be virtualized and executed by remotely accessible, networked computing devices configured in a cloud-computing configuration.

Storage device 904 includes one or more physical devices configured to hold instructions executable by the logic device to implement the methods and processes described herein. For example, storage device 904 may store instructions executable by logic device 902 to generate/operate user interfaces such as those illustrated in FIGS. 3-5B, 8B, and 8C, and/or to perform methods such as those illustrated in FIGS. 6A-7. When such methods and processes are implemented, the state of storage device 904 may be transformed—e.g., to hold different data.

Storage device 904 may include removable and/or built-in devices. Storage device 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage device 904 may include volatile, nonvolatile, dynamic, static, read/write, read-only, random-access, sequential-access, location-addressable, file-addressable, and/or content-addressable devices.

It will be appreciated that storage device 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic device 902 and storage device 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "application" may be used to describe an aspect of computing system 900 implemented to perform a particular function. In some cases, a module, program, or application may be instantiated via logic device 902 executing instructions held by storage device 904. It will be understood that different modules, programs, and/or applications may be instantiated from the same application, service, code block, object, library, routine, API, function, etc. Likewise, the same module, program, and/or application may be instantiated by different applications, services, code blocks, objects, routines, APIs, functions, etc. The terms "module," "program," and "application" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 906 may be used to present a visual representation of data held by storage device 904. This visual representation may take the form of a graphical user interface (GUI). Example graphical user interfaces are illustrated in FIGS. 3-5B, 8B, and 8C. As the herein described methods and processes change the data held by the storage device, and thus transform the state of the storage device, the state of display subsystem 906 may likewise be transformed to visually represent changes in the underlying data. Display subsystem 906 may include one or more display devices utilizing virtually any type of technology. Such display devices may be combined with logic device 902 and/or storage device 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity. For example, input subsystem 908 may include sensors for capturing information related to one or more components represented in a model of an electrical power system.

When included, communication subsystem 910 may be configured to communicatively couple mobile computing device 900a with one or more other computing devices, such as remote computing system 900b and/or other remote computing systems in a network. Communication subsystem 910 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow mobile computing device 900a to send and/or receive messages to and/or from other devices via a network such as the Internet.

For example, the above-described data structure and/or various generated views and associated metadata for the electrical power system may be transmitted from the generation device (e.g., the mobile computing device) to a network- or cloud-based server and/or directly to another computing device. In some examples, synchronization of the data structure and/or other information may be automatically performed (e.g., at predetermined/user-configurable time intervals and/or responsive to a trigger such as a threshold change in the data structure since a last synchronization) and/or performed responsive to user request (e.g., at the generation/mobile computing device and/or from an external device requesting the data from the generation/mobile computing device). In this way, other users may modify the data structure (e.g., via the above-described input/output modes as executed on other computing devices). The generating/mobile computing device may then receive changes to the data structure from the other computing device. For example, the above-described synchronization may also enable the generating/mobile computing device to update a locally-stored data structure with a modified data structure received from a network- or cloud-based server and/or directly from another computing device. The transmission and/or receipt of data may also allow users off-site to request and/or provide information from/to the user that is on-site and utilizing the generating/mobile computing device to generate and analyze the electrical power system model. In this way, information may be requested from off-site users before the on-site user leaves the electrical power system facility.

In an additional or alternative example, the communication subsystem may transmit and/or receive data from an external device that is on-site at the electrical power system facility. For example, the generating/mobile computing device may send data from the data structure representing the electrical power system to a portable printer (e.g., a label printer) such that information from the data structure may be printed out while the user is still on-site (e.g., data relating to a component may be printed to a label, such as an arc flash label, that may be adhered to that component in the electrical power system). The data may be sent to the printer wirelessly (e.g. via BLUETOOTH, Near-Field Communication, WIFI, or other wireless protocol) or via a wired connection.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

The invention claimed is:

1. A device comprising:
a touch-input display configured to detect touch input;
one or more sensors;
a processor; and
a storage device storing instructions executable by the processor to
receive an input of component data for a first electrical power system component along an electrical power path of an electrical power system, the first electrical power system component comprising one or more of a transformer, a switchgear, a panel, a load device, and a motor control center;
display a graphical representation of the first electrical power system component in a schematic view in an input/output user interface;
receive an input of sensor data for the first electrical power system component via a first sensor of the one or more sensors including one or more of a parameter and an equipment device setting for the first electrical power system component;
store the sensor data for the first electrical power system component with the component data for the first electrical power system component in a directed graph data structure comprising nodes representing components in the electrical power system and connectivities representing conductors in the electrical power system;
when an input of connectivity data describing a conductor connecting the first electrical power system component to a second electrical power system component along the electrical power path is received, then store the connectivity data for a connection between the first electrical power system component and the second electrical power system component in the directed graph data structure, otherwise store a default conductor for the connection between the first electrical power system component and the second electrical power system component in the directed graph data structure;
receive a request to view the sensor data for the first electrical power system component in a tabular view in the input/output user interface; and
in response, display a text- or cell-based representation of the sensor data for the first electrical power system component in the input/output user interface, wherein the components and the connectivities shown in the schematic view along a common line are represented in the text- or cell-based representation by cells extending in a common direction.

2. The device of claim 1, wherein the instructions are further executable to
receive an input of component data for the second electrical power system component along the electrical power path via a second sensor of the one or more sensors, the second electrical power system component being connected to the first electrical power system component via the conductor,
display a graphical representation of the second electrical power system component in the input/output user interface,
receive an input of sensor data corresponding to the second electrical power system component via the second sensor of the one or more sensors,
store the sensor data for the second electrical power system component with the component data and the connectivity data for the second electrical power system component in the directed graph data structure,
receive a request to view the sensor data for the second electrical power system component in the tabular view in the input/output user interface, and
in response, display a text- or cell-based representation of the sensor data for the second electrical power system component in the input/output user interface.

3. The device of claim 1, wherein the first sensor comprises an image sensor, the sensor data comprising an image of a feature of the first electrical power system component, and wherein the instructions are further executable to automatically populate parameters for the first electrical power system component in the directed graph data structure based on the image.

4. The device of claim 1, wherein the first sensor comprises one or more of a global positioning system (GPS) sensor and a radiofrequency identification (RFID) sensor.

5. The device of claim 4, wherein the instructions are further executable to determine a conductor length of the conductor connecting the first electrical power system component to the second electrical power system component based on the sensor data from the GPS sensor.

6. The device of claim 4, wherein the instructions are further executable to associate a location of one or more of the first electrical power system component and the second electrical power system component with a location on a map of the electrical power system based on the sensor data from the GPS sensor.

7. The device of claim 1, further comprising a communication subsystem configured to synchronize data from the directed graph data structure with a cloud-based server.

8. Enacted on a device comprising a touch-input display configured to detect touch input and one or more sensors, a method of acquiring data for constructing an electrical power system model, the method comprising:
receiving an input of component data for a first electrical power system component along an electrical power path of an electrical power system, the first electrical power system component comprising one or more of a transformer, a switchgear, a panel, a load device, and a motor control center;
displaying a graphical representation of the first electrical power system component in a schematic view in an input/output user interface;
receiving an input of sensor data for the first electrical power system component via a first sensor of the one or more sensors including one or more of a parameter and an equipment device setting for the first electrical power system component;

storing the sensor data for the first electrical power system component with the component data for the first electrical power system component in a directed graph data structure comprising nodes representing components in the electrical power system and connectivities representing conductors in the electrical power system;

when an input of connectivity data describing a conductor connecting the first electrical power system component to a second electrical power system component along the electrical power path is received, then storing the connectivity data for a connection between the first electrical power system component and the second electrical power system component in the directed graph data structure, otherwise storing a default conductor for the connection between the first electrical power system component and the second electrical power system component in the directed graph data structure;

receiving a request to view the sensor data for the first electrical power system component in a tabular view in the input/output user interface; and in response, displaying a text- or cell-based representation of the sensor data for the first electrical power system component in the input/output user interface, wherein components and the connectivities shown in the schematic view along a common line are represented in the text- or cell-based representation by cells extending in a common direction.

9. The method of claim 8, further comprising:
receiving an input of component data for the second electrical power system component along the electrical power path via a second sensor of the one or more sensors, the second electrical power system component being connected to the first electrical power system component via the conductor, displaying a graphical representation of the second electrical power system component in the input/output user interface, receiving an input of sensor data corresponding to the second electrical power system component via the second sensor of the one or more sensors, storing the sensor data for the second electrical power system component with the component data and the connectivity data for the second electrical power system component in the directed graph data structure, receiving a request to view the sensor data for the second electrical power system component in the tabular view in the input/output user interface, and in response, displaying a text- or cell-based representation of the sensor data for the second electrical power system component in the input/output user interface.

10. The method of claim 8, wherein the first sensor comprises an image sensor, the sensor data comprising an image of a feature of the first electrical power system component, and the method further comprising automatically populating parameters for the first electrical power system component in the directed graph data structure based on the image.

11. The method of claim 8, further comprising determining a conductor length of the conductor connecting the first electrical power system component to the second electrical power system component based on the sensor data from a GPS sensor.

12. The method of claim 8, further comprising associating a location of one or more of the first electrical power system component and the second electrical power system component with a location on a map of the electrical power system based on the sensor data from a GPS sensor.

13. The method of claim 8, further comprising, via a communication subsystem of the device, synchronizing data from the directed graph data structure with a cloud-based server.

14. A non-transitory computer readable medium storing instructions that, when executed by a device comprising a touch-input display configured to detect touch input and one or more sensors, cause the device to:

receive an input of component data for a first electrical power system component along an electrical power path of an electrical power system, the first electrical power system component comprising one or more of a transformer, a switchgear, a panel, a load device, and a motor control center;

display a graphical representation of the first electrical power system component in a schematic view in an input/output user interface;

receive an input of sensor data for the first electrical power system component via a first sensor of the one or more sensors including one or more of a parameter and an equipment device setting for the first electrical power system component;

store the sensor data for the first electrical power system component with the component data for the first electrical power system component in a directed graph data structure comprising nodes representing components in the electrical power system and connectivities representing conductors in the electrical power system;

when an input of connectivity data describing a conductor connecting the first electrical power system component to a second electrical power system component along the electrical power path is received, then store the connectivity data for a connection between the first electrical power system component and the second electrical power system component in the directed graph data structure, otherwise store a default conductor for the connection between the first electrical power system component and the second electrical power system component in the directed graph data structure;

receive a request to view the sensor data for the first electrical power system component in a tabular view in the input/output user interface; and in response, display a text- or cell-based representation of the sensor data for the first electrical power system component in the input/output user interface, wherein the components and the connectivities shown in the schematic view along a common line are represented in the text- or cell-based representation by cells extending in a common direction.

15. The non-transitory computer readable medium of claim 14, wherein the instructions are further executable to:
receive an input of component data for the second electrical power system component along the electrical power path via a second sensor of the one or more sensors, the second electrical power system component being connected to the first electrical power system component via the conductor, display a graphical representation of the second electrical power system component in the input/output user interface, receive an input of sensor data corresponding to the second electrical power system component via the second sensor of the one or more sensors, store the sensor data for the second electrical power system component with the component data and the connectivity data for the second electrical power system component in the directed graph data structure, receive a request to view the sensor data for the second electrical power system component in the tabular view in the input/output user interface, and in response, display a text- or cell-based representation of the sensor data for the second electrical power system component in the input/output user interface.

16. The non-transitory computer readable medium of claim 14, wherein the first sensor comprises an image sensor, the sensor data comprising an image of a feature of the first electrical power system component, and wherein the instructions are further executable to automatically populate parameters for the first electrical power system component in the directed graph data structure based on the image.

17. The non-transitory computer readable medium of claim 14, wherein the instructions are further executable to determine a conductor length of the conductor connecting the first electrical power system component to the second electrical power system component based on the sensor data from a GPS sensor.

18. The non-transitory computer readable medium of claim 14, wherein the instructions are further executable to associate a location of one or more of the first electrical power system component and the second electrical power system component with a location on a map of the electrical power system based on the sensor data from a GPS sensor.

19. The non-transitory computer readable medium of claim 14, wherein the instructions are further executable to, via a communication subsystem of the device, synchronize data from the directed graph data structure with a cloud-based server.

* * * * *

UNITED STATES PATENT AND TRADEMARK OFFICE
CERTIFICATE OF CORRECTION

PATENT NO. : 10,528,654 B2
APPLICATION NO. : 14/875616
DATED : January 7, 2020
INVENTOR(S) : McAravey et al.

It is certified that error appears in the above-identified patent and that said Letters Patent is hereby corrected as shown below:

On the Title Page

Item (54) and in the Specification, Column 1, Line 1, delete "A" and insert --AN--

Signed and Sealed this
Thirty-first Day of March, 2020

Andrei Iancu
*Director of the United States Patent and Trademark Office*